US012281412B2

(12) United States Patent
Ebner et al.

(10) Patent No.: US 12,281,412 B2
(45) Date of Patent: Apr. 22, 2025

(54) APPARATUS FOR HEATING MULTIPLE CRUCIBLES

(71) Applicant: Ebner Industrieofenbau GmbH, Leonding (AT)

(72) Inventors: Robert Ebner, Leonding (AT); Kanaparin Ariyawong, Leonding (AT); Chih-Yung Hsiung, Leonding (AT); Ghassan Barbar, Neunkirchen (DE)

(73) Assignee: Ebner Industrieofenbau GmbH, Leonding (AT)

( * ) Notice: Subject to any disclaimer, the term of this patent is extended or adjusted under 35 U.S.C. 154(b) by 159 days.

(21) Appl. No.: 17/927,810

(22) PCT Filed: Apr. 27, 2021

(86) PCT No.: PCT/AT2021/060145
§ 371 (c)(1),
(2) Date: Nov. 25, 2022

(87) PCT Pub. No.: WO2021/217191
PCT Pub. Date: Nov. 4, 2021

(65) Prior Publication Data
US 2023/0203713 A1    Jun. 29, 2023

(30) Foreign Application Priority Data
Apr. 27, 2020   (DE) .................. 10 2020 111 456.7

(51) Int. Cl.
*C30B 35/00*   (2006.01)
*C30B 23/06*   (2006.01)
(Continued)

(52) U.S. Cl.
CPC .......... *C30B 35/002* (2013.01); *C30B 23/066* (2013.01); *C30B 25/08* (2013.01); *C30B 25/10* (2013.01); *F27B 14/14* (2013.01)

(58) Field of Classification Search
CPC ... C30B 11/002; C30B 11/003; C30B 11/006; C30B 11/007; C30B 23/066;
(Continued)

(56) References Cited

U.S. PATENT DOCUMENTS 8,652,253 B2   2/2014   Eichler et al.
9,368,585 B2   6/2016   Eichler et al.
(Continued)

FOREIGN PATENT DOCUMENTS

CN   107236986 A   * 10/2017   ............. C30B 11/00
CN   110502659 A   11/2019
(Continued)

OTHER PUBLICATIONS

European Patent Office, English computer translation of JP-2000203981-A (Year: 2024).*
(Continued)

*Primary Examiner* — Matthew J Song
(74) *Attorney, Agent, or Firm* — Collard & Roe, P.C.

(57) ABSTRACT

A crucible device includes a heating chamber, at least a first crucible in which a first crystal is growable, and at least a second crucible in which a second crystal is growable. The first crucible and the second crucible are arranged within the heating chamber spaced apart from each other along a horizontal and vertical and any orientational direction. The crucible device further comprises a heating system arranged within the heating chamber, wherein the heating system is configured for adjusting a temperature along the horizontal and vertical and any orientational directions.

11 Claims, 3 Drawing Sheets

(51) Int. Cl.
*C30B 25/08* (2006.01)
*C30B 25/10* (2006.01)
*F27B 14/14* (2006.01)

(58) Field of Classification Search
CPC ......... C30B 25/08; C30B 25/10; C30B 29/20;
C30B 29/36; C30B 29/403; C30B 35/002;
F27B 14/14; F27B 14/20; F27B
2014/0881
See application file for complete search history.

(56) References Cited

U.S. PATENT DOCUMENTS

| | | | |
|---|---|---|---|
| 10,094,040 B2 | 10/2018 | Jones et al. | |
| 2003/0089307 A1* | 5/2003 | Wehrhan | C30B 11/003 117/200 |
| 2004/0173140 A1* | 9/2004 | Liu | C30B 11/00 117/83 |
| 2005/0241569 A1* | 11/2005 | Oyama | C30B 29/12 117/73 |
| 2007/0151510 A1* | 7/2007 | Muhe | C30B 11/003 117/34 |
| 2014/0103493 A1* | 4/2014 | Eichler | C30B 11/007 257/617 |
| 2014/0248739 A1 | 9/2014 | Bakke et al. | |
| 2019/0330764 A1 | 10/2019 | Fujikawa | |
| 2022/0122343 A1 | 4/2022 | Li et al. | |

FOREIGN PATENT DOCUMENTS

| | | | | |
|---|---|---|---|---|
| DE | 102007006731 A1 | * | 8/2008 | ........... C30B 11/003 |
| DE | 10 2007 026 298 A1 | | 12/2008 | |
| DE | 10 2008 034029 A1 | | 1/2010 | |
| JP | 10251097 A | * | 9/1998 | ............. C30B 29/12 |
| JP | 2000290097 A | | 10/2000 | |
| JP | 2000203981 A | * | 7/2005 | ............. C30B 11/00 |
| JP | 2009190914 A | * | 8/2009 | ............. C30B 11/00 |
| JP | 2013-075771 A | | 4/2013 | |
| KR | 20110080527 A | * | 7/2011 | ............. C30B 15/00 |
| KR | 101758646 B1 | * | 2/2017 | ............. C30B 23/00 |
| KR | 20170013668 A | * | 2/2017 | ............. C30B 29/36 |
| KR | 1020170034812 | * | 3/2017 | ............. C30B 29/36 |
| KR | 1020170034812 A | | 3/2017 | |
| TW | 201321564 A1 | | 6/2013 | |
| WO | 2015/067552 A1 | | 5/2015 | |

OTHER PUBLICATIONS

European Patent Office, English computer translation of JP-10251097-A (Year: 2024).*
European Patent Office, English computer translation of JP-2009190914-A (Year: 2024).*
European Patent Office, English computer translation of CN-107236986-A (Year: 2024).*
European Patent Office, English computer translation of DE-102007006731-A1 (Year: 2024).*
European Patent Office, English computer translation of KR1020170034812 (Year: 2024).*
English computer translation of CN-107236986-A (Year: 2024).*
English computer translation of KR-101758646-B1 (Year: 2024).*
English computer translation of KR-20110080527-A (Year: 2024).*
English computer translation of KR-20170013668-A (Year: 2024).*
International Preliminary Report on Patentability in PCT/AT2021/060145, dated Aug. 10, 2022.
International Search Report of PCT/AT2021/060145, mailed Aug. 3, 2021.

* cited by examiner

APPARATUS FOR HEATING MULTIPLE CRUCIBLES

CROSS REFERENCE TO RELATED APPLICATIONS

This application is the National Stage of PCT/AT2021/060145 filed on Apr. 27, 2021, which claims priority under 35 U.S.C. § 119 of German Application No. 10 2020 111 456.7 filed on Apr. 27, 2020, the disclosure of which is incorporated by reference. The international application under PCT article 21 (2) was published in English.

FIELD OF INVENTION

The present invention relates to a sort of growth chamber for growing crystals and to a method for growing crystals.

ART BACKGROUND

In more and more technical fields, monocrystalline material is required, for example for wafers in the field of semiconductor technology. A single crystal or monocrystalline solid is a material in which a crystal lattice of the entire sample is continuous and unbroken to the edges of the sample without grain boundaries. The absence of the defects associated with grain boundaries can give monocrystals unique properties, particularly mechanical, optical and electrical, which can also be anisotropic, depending on the type of crystallographic structure. These properties, in addition to making them precious in some gems, are industrially used in technological applications, especially in optics and electronics.

Crystal growth is the process where a pre-existing crystal becomes larger as more atoms or molecules or ions add in their positions in the crystal lattice. A crystal is defined as being atoms, molecules, or ions arranged in an orderly repeating pattern, a crystal lattice, extending in all three spatial dimensions. So crystal growth differs from growth of a liquid droplet in that during growth the molecules or ions must fall into the correct lattice positions in order, for a well-ordered crystal to grow.

For example, crystal growth may be used to obtain single crystals of compounds and semiconductors (e.g. Carbides, Oxides, Fluorides, Nitrides silicon, germanium and gallium arsenide), metals (e.g. palladium, platinum, silver, gold), salts and synthetic gemstones.

A further application may be the growth of large cylindrical ingots, or boules, of single crystal silicon used in the electronics industry to make semiconductor devices like integrated circuits chips, transistors, high power devices and so on.

For growing crystals, respective crystal furnaces are used which provide a sufficient temperature such that crystal growth takes place. However, it is difficult to provide an adjustable temperature field in a heating chamber of the crystal furnace.

SUMMARY OF THE INVENTION

Hence, it is an object of the present invention to provide a crystal furnace providing an adjustable temperature field in a respective heating chamber.

This object is solved by a growth chamber (i.e. a crucible device) for growing crystals and by a method for growing crystals according to the subject matters of the independent claims.

According to first aspect of the present invention, a crucible device for growing crystals is presented. The crucible device comprises a heating chamber, at least a first crucible in which a first crystal is growable and at least a second crucible in which a second crystal is growable. The first crucible and the second crucible are arranged within the heating chamber spaced apart from each other along a horizontal direction. the crucible device comprises a heating system arranged within the heating chamber, wherein the heating system is configured for adjusting a temperature, specifically along the horizontal and/or vertical direction or any other orientational directions.

According to further aspect, a method for growing crystals is described. According to the method a temperature within a heating chamber, specifically along the horizontal and/or vertical direction or any other orientational direction, is adjusted by a heating system arranged within the heating chamber. At least a first crucible in which a first crystal is growable and a second crucible in which a second crystal is growable are arranged within the heating chamber spaced apart from each other along a horizontal direction.

The crucible device may be an apparatus, such as a furnace, comprising the heating chamber which provides a heatable accommodation space for the crucibles. The heating system heats the inner volume of the crucibles until a desired temperature is reached. The temperature which may be provided inside the inner volume of the heating chamber and the crucibles, respectively, may be 100° C. to 1400° C., preferably to approximately 2200° C. or more.

The heating system comprises specifically respective heating elements which are spaced apart from each other along the horizontal direction such that specific horizontally spaced locations inside the heating chamber can be heated, in particular individually with respect to each other, such that a desired temperature gradient along the horizontal direction can be adjusted. Specifically, a constant temperature along the horizontal direction, but also along the vertical direction can be adjusted. Also a defined temperature gradient in particular along the vertical direction (and also in an example along a horizontal direction) may be exactly adjusted in order to provide an optimal control of the crystal growth. The heating elements can be RF (radio frequency) heaters or resistive heaters and/or heating generators. Furthermore, heating elements may be formed by an inlet injecting hot medium, such as high temperature gas. The heating elements may form single heating blocks which are arranged at the specific location inside the heating chamber. Furthermore, as described below, the heating elements may form long heating arrays/lines having for example a linear or circular extension.

The heating chamber may comprise an insulating material, such that the inner volume of the heating chamber is thermally isolated from an environment. In the heating chamber of the crucible device at least two or a plurality of first and second crucibles can be arranged. The plurality of crucibles may be arranged along a linear, translatory arrangement direction. Furthermore, the plurality of crucibles may be arranged along a circular, rectangular or elliptical arrangement direction.

Each crucible comprises an inner volume in which the crystal growing takes place. The crucible may be made of a material selected from one of the groups (compositions) comprising metal based, oxide based, nitride based, carbon based and dense graphite. Inside the crucible, a seed element may be placed. The seed element is made of a desired single crystal material, for an example, SiC (Silicon carbide). Furthermore, a source material, such as a reaction fluid, e.g.

a desired crystal material, e.g. high purity SiC powder, is put into the inner volume of the crucible. The reaction fluid may be injected by tube lines comprising for example nozzles. If the temperature inside the crucible increases, the desired material within a reaction fluid growth onto a surface of the seed crystal. Furthermore, a further source of crystal material may be injected, for example via tube lines, wherein the source material is selected from one of the groups (compositions) consisting of solid phase material, liquid phase, gaseous phase material and/or a mixture of the above phases. The reaction fluid may comprise methyl trichlorosilane (MTS) and e.g. precursors, such as SiH4 (silane) or CxHy. Furthermore, metal materials, ceramic materials or components thereof may be used as source material. Furthermore, further openings may be provided to the crucible in order to extract surplus material out of the respective crucible.

The crucibles may comprise a cylindrical shape having a circular, elliptical or rectangular base surface.

The seed crystal may be fixed to the respective fixing region inside the crucible for example by clamping means and/or by gluing with adhesive materials.

Inside the inner volume of the crucible, it is an aim to provide a desired exact temperature gradient for controlling the growth of the crystal at a growth surface. However, it is difficult to provide for example constant temperatures along a horizontal direction inside the heating chamber. Specifically, one side of the crucible may have different temperature with respect to a horizontal opposing side of the crucible, since one side is for example closer to a wall of the heating chamber or to a heating element of the heating chamber.

Hence, by the approach of the present invention, a heating system is provided which comprises for example heating elements which are arranged inside the heating chamber and wherein the heating system together with its heating elements comprises an adjustable, specifically a uniform temperature profile along the horizontal direction and/or vertical direction. Hence, by the inventive apparatus a uniform temperature profile along the crystal surface can be adjusted, so that an isothermal or zero temperature gradient along the crystal surface can be provided. In this context e.g. the horizontal direction runs within a horizontal plane. For example, the bottom of the crucible is arranged as well within the horizontal plane or comprise a bottom surface being parallel to the horizontal plane. The plurality of crucibles is in particular spaced apart from each other along the horizontal direction. A vertical direction is defined perpendicular to the horizontal direction.

Hence, at a specific height and vertical position, respectively, within the first crucible a similar temperature is adjustable with respect to a temperature at a specific height and vertical position of an adjacent second crucible. Hence, a constant crystal growth of crystals in all adjacent crucibles can be provided.

According to further exemplary embodiment of the present invention, the heating system comprises a heating element extending along the first crucible and the second crucible. In other words, the heating element passes the plurality of crucibles in particular along a respective first side of each crucible. Hence, the temperature along the first side of each crucible is adjustable by the heating element, so that the temperature along the first side may be adjusted to the temperature of an opposing second side of the crucible such that specifically a uniform temperature profile along the horizontal direction can be achieved.

According to further exemplary embodiment, the heating element is an inner heating ring, wherein the inner heating ring is arranged between the first crucible and the second crucible. In other words, a plurality of first and second crucibles may be arranged along a circular arrangement, wherein the inner heating ring is surrounded by a respective plurality of crucibles. Hence, the inner region surrounded by the plurality of crucibles can be adjusted with respect to an outer region surrounding the crucibles.

According to further exemplary embodiment, the heating system comprises a further heating element extending along the first crucible and the second crucible. In other words, the further heating element passes the plurality of crucibles in particular along a respective second side of each crucible, wherein the second side of each crucible is an opposite side with respect to the first side of each crucible. In other words, the plurality of crucibles may be arranged between the respective heating elements and the further heating elements. Hence, the heating element and the further heating element may define a uniform temperature profile along the horizontal direction through a respective crucible. However, according to another exemplary embodiment, the temperature gradient may be adjusted such that different temperatures of the first side and the second side of the crucibles is adjusted by the heating element and the further heating element. In other words, the heating element may provide a different heating energy to a first side of the crucibles with respect to the heating energy applied at second side of the crucibles generated by the further heating element.

According to further exemplary embodiment, the outer heating element is an outer heating ring, wherein the first crucible and the second crucible are arranged inside the outer heating ring. The outer heating ring comprises a larger diameter than the inner heating ring and the inner heating ring is arranged within the outer heating ring. The first crucible and the second crucible are arranged between the inner heating ring and the outer heating ring. The first crucible and the second crucible are arranged circumferentially around the inner heating ring such that the inner sides of the crucibles are directed to the inner heating ring and the outer side of the crucibles are directed to the outer heating ring.

The inner heating ring and the outer heating ring are for example resistive heating elements or heating ring tubes which are flushed by heating medium.

According to further exemplary embodiment, the heating element is an inner heating element, wherein the heating system comprises a further inner heating element extending along the first crucible and the second crucible and wherein the inner heating element and the further inner heating element are arranged above each other and spaced apart from each other, such that a lower volume of the heating chamber is heatable by the inner heating element and an upper volume of the heating chamber is heatable by the further inner heating element. At least a first lower section of the first crucible is arranged in the lower volume and at least a first upper section of the first crucible is arranged in the upper heating volume.

Hence, the inner heating element and the further inner heating element are arranged above each other along a vertical direction, such that a vertical temperature gradient along the vertical direction is adjustable. Specifically, the further inner heating element forms a further inner heating ring arranged above the inner heating ring as described above.

Specifically, the growth surface of the crystal changes its vertical position within the crucible due to the growing of the crystal. Hence, the temperature at the respective growth surface can be exactly adjusted considering the vertical location of the growth surface. For example, at the region of the growth surface, a different temperature may be adjusted with respect to an upper or lower location with respect to the growth surface. However, it is also possible to provide different vertical heating zones within the crucible.

According to further exemplary embodiment, the further heating element is an outer heating element, wherein the heating system comprises a further outer heating element extending along the first crucible and the second crucible and wherein the outer heating element and the further outer heating element are arranged above each other and spaced apart from each other, such that the lower volume of the heating chamber is heatable by the outer heating element and the upper volume of the heating chamber is heatable by the further outer heating element.

Hence, the outer heating element and the further outer heating element are arranged above each other along a vertical direction, such that a vertical temperature gradient is adjustable. Specifically, the further outer heating element forms a further outer heating ring arranged above the outer heating ring as described above.

For example, in an embodiment comprising the inner ring, the outer ring, the further inner ring and the further outer ring, on four sections (the upper section and lower section at the first side and the upper and lower section of an opposing second side) of the crucibles specific temperatures may be adjusted, such that a constant temperature along the horizontal direction and/or a temperature gradient along the vertical direction within the crucible volume is adjustable.

Furthermore, in a further exemplary embodiment, between the lower heating elements and the upper heating elements, a plurality of further intermediate heating elements may be arranged in order to provide different temperature sections along the vertical direction. For example, a plurality of inner and/or outer heating rings may be arranged above each other. In a further exemplary embodiment, the plurality of heating rings is movable with respect to each other along the vertical direction.

According to further exemplary embodiment, at least the heating element is, in particular vertically, movably arranged within the heating chamber. Hence, the temperature gradient may be adjusted very precisely and e.g. a constant temperature is adjustable. For example, the heating element can be adjusted along the horizontal direction, such that the (horizontal) distance of the heating element to the respective crucible is adjustable.

Additionally, or alternatively, the heating element is adjustable along a vertical direction, such that the heating element is arrangeable between for example a top and a bottom of the crucible and the plurality of crucibles, respectively. In an exemplary embodiment, the inner or outer heating ring may adjust its diameter in order to adjust the distance between the crucibles and the respective heating rings.

In an exemplary embodiment, the inner heating element and the outer heating element are arranged at the bottom sections of the crucibles wherein above the respective inner and outer heating elements respective further inner and outer heating elements are arranged which are adjustable along a vertical direction with respect to the inner and outer heating elements below. Additionally, also the heating elements arranged at the bottom sections of the crucible may be movable along the vertical direction.

For example, guiding rails along the respective vertical or horizontal direction may be adjusted within the heating chamber, when the respective heating elements may move and slide along the respective guiding rails. The movement of the respective heating elements along the guiding rails may be controlled by respective servo motors. Additionally, also control pistons may be arranged within the heating chamber in order to move the respective heating elements along the desired horizontal or vertical direction.

According to further exemplary embodiment, the heating system comprises a thermal resistance isolation arranged in the heating chamber, such that the thermal resistance isolation separates the heating chamber in a first heating volume and a second heating volume. Specifically, the heating system is configured for heating the first heating volume and the second heating volume independent from each other. For example, the first heating volume is a lower heating volume and the second heating volume is an upper heating volume of the heating chamber.

According to further exemplary embodiment, the thermal resistance isolation comprises a vertical thermal resistance sheet being arranged between the first crucible and the second crucible and extending along a vertical direction for separating the heating chamber in a first heating volume and a second heating volume, wherein the first crucible is arranged in the first heating volume and the second crucible is arranged in the second heating volume. Hence, by the vertical thermal resistance sheet, temperature gradients or a constant temperature between for example two adjacent crucibles can be adjusted more precisely. The vertical thermal resistance sheet has in particular a vertical extending direction and accordingly extends between the bottom section of the crucibles to the top section of the crucibles. The vertical thermal resistance sheet may be formed for example from thermal isolating material, such as carbonized rayon fibres and the like.

According to further exemplary embodiment, the thermal resistance isolation comprises a horizontal thermal resistance sheet extending in a horizontal direction for separating the heating chamber in an upper volume and a lower volume, wherein at least a first upper section of the first crucible is arranged in the first upper volume and at least a first lower section of the first crucible is arranged in the lower volume. Hence, the temperature of the crucible in the upper volume and the temperature of the crucible in the lower volume can be adjusted more precisely since both volumes are thermally isolated by the horizontal thermal resistance sheet. Specifically, if a heating element is arranged in the lower volume and a further heating element is arranged in the upper volume, two temperature sections with a large stepwise temperature difference may be adjusted. The horizontal thermal resistance sheet has in particular a horizontal extending direction and accordingly may extend between at least two adjacent crucibles. The horizontal thermal resistance sheet may be formed for example from thermal isolating material, such as carbonized rayon fibres and the like.

Specifically, according to further exemplary embodiment, the vertical and/or specifically the horizontal thermal resistance sheet are movable. In particular, the horizontal thermal resistance sheet is movably, in particular along a vertical direction, arranged within the heating chamber, such that the height of the first upper volume and the second lower volume is adjustable. For example, the horizontal thermal resistance sheet may be coupled to a vertical guiding rail which is arranged for example at a side wall of the heating chamber, such that the horizontal thermal resistance sheet is movable along the vertical guiding rail.

According to further exemplary embodiment, the horizontal thermal resistance sheet comprises at least one through hole through which the first crucible is insertable, wherein the horizontal thermal resistance sheet comprises in particular a second through hole to which the second crucible is insertable. Hence, at least one crucible or all crucibles are insertable in respective through holes within the horizontal thermal resistance sheet. Hence, the horizontal thermal resistance sheet provides only small gaps to the crucibles and for example to the wall of the heating chamber, such that a proper thermal isolation between an upper volume and a lower volume separated by the horizontal thermal resistance sheet is provided.

According to further exemplary embodiment, at least the first crucible is, in particular vertically, movably arranged within the heating chamber. For example, the first crucible or all crucibles may be arranged at respective lifting tables or lifting pistons so that the first crucible and or all crucibles may be lifted along the vertical direction in order to be moved in a desired temperature zone within the heating chamber.

According to further exemplary embodiment, at least the first crucible is rotatably arranged within the heating chamber. For example, by the exemplary embodiment, the crucible may be rotated, such that an inner first side of a crucible may be rotated from a in the position to an outer position within the temperature chamber, for example.

According to further exemplary embodiment, the crucible device further comprises a rotary table on which the first crucible and the second crucible are arranged, wherein the rotary table is rotatable with respect to the heating system. Hence, the respective crucibles may be positioned along a circumferential direction at a desired position within the heating chamber at which a desired temperature gradient is adjusted.

According to further exemplary embodiment, the heating chamber comprises a plurality of viewports through which respective sensors, in particular temperature sensors, are protruding within the heating chamber. Hence, a proper monitoring of the heating zones within the heating chamber is provided. Based on the measured temperatures and heating zones, respectively, the heating element of the heating system may be adjusted individually.

According to further exemplary embodiment, at least the first crucible comprises a tube line which is guided through the heating chamber for supplying source material within the first crucible and/or for draining off source material out of the first crucible. For example, a plurality of respective tube lines may be coupled to the respective crucible.

According to further exemplary embodiment, the tube line is coupled to a bottom of the first crucible, wherein the first crucible comprises in particular a seed fixing section for fixing a seed crystal. The seed fixing section may be located at a top section or bottom section of the crucible.

Summarizing, by the present invention, a multiple crucibles resistive heating furnace for crystal growth (for crystals consisting of e.g. SiC, AlN, Al2O3, etc.) is provided. The arrangement of the plurality of crucibles may be circular, longitudinal, or along a curve line, for example. Each crucible can be used for growing crystal of any size, i.e., it can be scaling up expectedly to 16 inches. According to the present invention, a heating system comprising independent (horizontal and vertical) heating elements for precise control of the thermal field within the heating chamber is provided. The heating elements may be movable for precise control of the thermal field of the heating chamber. Also the crucibles may be movable (lifting up and down the crucibles) for precise control of the thermal field. furthermore, movable thermal resistance sheets/screens (i.e. insulation) for precise control of the thermal field for the heating chamber are provided. Additionally, multiple view ports for precise control of the thermal field for the heating chamber are provided. Furthermore, rotation of the crucibles to enhance a uniformity of thermal field and mixing of reactive and carrier (source) material components in the growth chamber/crucible is provided. Hence, a nearly isothermal crystal growth front at the growth surface for minimum thermal stress and dislocations may be provided. Furthermore, high porosity material channel(s) (tube lines) for direct feeding of reactive and/or doping components (for vapor phase crystal growth).

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this application.

BRIEF DESCRIPTION OF THE DRAWING

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF EXEMPLARY EMBODIMENTS

Figure 1:
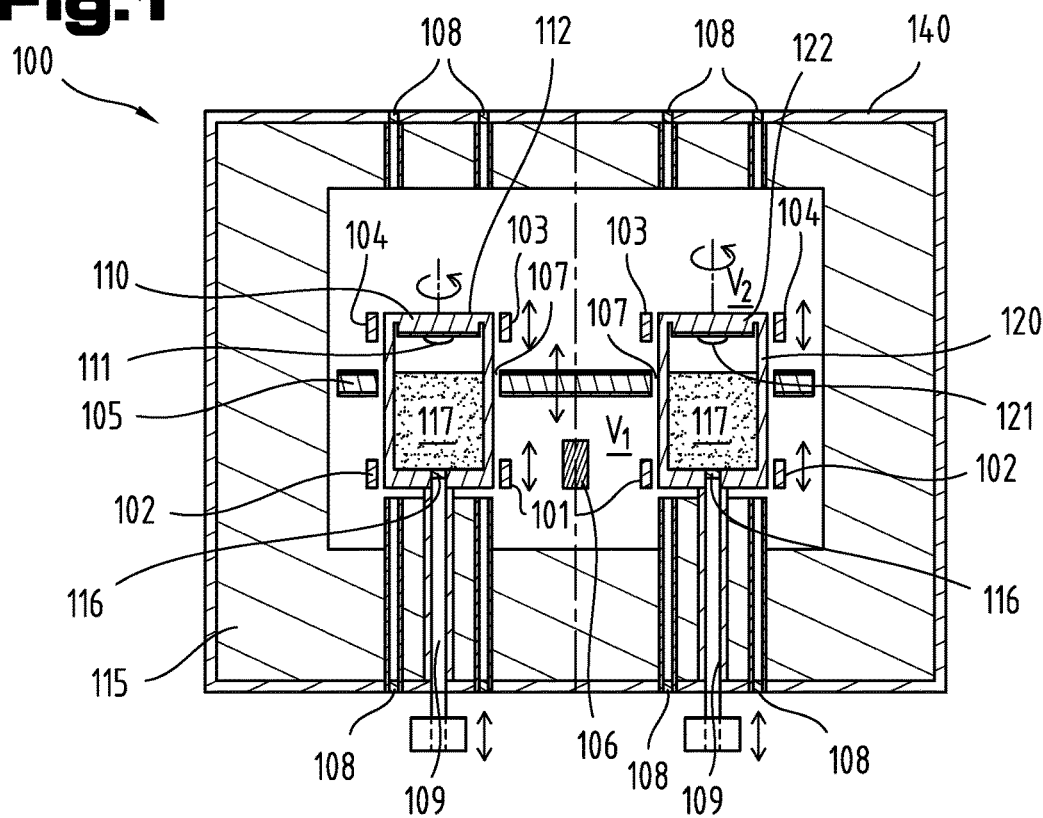
FIG. 1 shows a schematic view of a crucible device according to an exemplary embodiment of the present invention.

The illustrations in the drawings are schematic. It is noted that in different figures similar or identical elements are provided with the same reference signs.

FIG. 1 shows a schematic view of a crucible device 100 for growing crystals 111, 121 according to an exemplary embodiment of the present invention. The crucible device 100 comprises a heating chamber 140, at least a first crucible 110 in which a first crystal 111 is growable, and at least a second crucible 120 in which a second crystal 121 is growable. The first crucible 110 and the second crucible 120 are arranged within the heating chamber 140 spaced apart from each other along a horizontal direction. The crucible device 100 further comprises a heating system arranged within the heating chamber 140, wherein the heating system is configured for adjusting a temperature along the horizontal and vertical and any orientational directions.

The crucible device 100 is a furnace comprising the heating chamber 140 which provides a heatable accommodation space for the crucibles 110, 120. The heating system heats the inner volume of the crucibles 110, 120 until a desired temperature is reached. The temperature which may be provided inside the inner volume of the heating chamber 140 and the crucibles 110, 120, respectively, may be 100° C. to 1400° C., preferably to approximately 2200° C. or more.

The heating system comprises specifically respective heating elements 101, 102, 103, 104 which are spaced apart from each other along the horizontal and vertical and any orientational directions such that specific horizontally vertically and any orientationally spaced locations inside the heating chamber 140 can be heated, in particular individually with respect to each other, such that a desired temperature gradient along the horizontal and vertical and any orientational directions can be adjusted. The heating elements 101, 102, 103, 104 may be RF (radio frequency) heaters, resistive heaters and heating generators. Furthermore, heating element may be formed by an inlet injecting hot medium, such as high temperature gas. The heating elements 101, 102, 103, 104 may form single heating blocks which are arranged at the specific location inside the heating chamber 140. Furthermore, as shown in detail in FIG. 2, the heating elements 101, 102, 103, 104 may form long heating arrays/lines having for example a linear or circular extension.

The heating chamber 140 may comprise an insulating material 115, such that the inner volume of the heating chamber 140 is thermally isolated. In the heating chamber 140 of the crucible device 100 at least two or a plurality of first and second crucibles 110, 120, 130 can be arranged. The plurality of crucibles 110, 120, 130 may be arranged along a linear, translatory arrangement direction. Furthermore, the plurality of crucibles 110, 120, 130 may be arranged along a circular arrangement direction (see FIG. 2).

Each crucible 110, 120 comprises an inner volume in which the crystal growing takes place. Inside the crucible 110, 120, a seed element may be placed. The seed element is made of a desired single crystal material, such as sapphire. Furthermore, a source material 117, which provide a reaction fluid of a desired crystal material, e.g. high purity SiC powder, is put into the inner volume of the crucible 110, 120. The reaction fluid may be injected by tube lines 109 comprising for example nozzles or a porous element 116.

The seed crystal may be fixed to the respective fixing region inside the crucible 110, 120 for example by clamping means and/or by gluing with adhesive materials. As shown in FIG. 1, the first crystal 111 and the second crystal 121 are fixed at top sections 112, 122 of the respective first and second crucibles 110, 120, such that the crystals 111, 121 growth from the top section 112, 122 to a respective bottom section of the respective crucible 110, 120 takes place.

The heating system comprises for example an inner heating element 101 and a further inner heating element 103 extending along the first crucible 110 and the second crucible 120. The inner heating element 101 and the further inner heating element 103 are arranged above each other and spaced apart from each other, such that a lower volume $V_1$ of the heating chamber 140 is heatable by the inner heating element 101 and an upper volume $V_2$ of the heating chamber 140 is heatable by the further inner heating element 103. At least a lower section of the crucibles 110, 120 is arranged in the lower volume $V_1$ and at least an upper section of the crucibles 110, 120 is arranged in the upper heating volume $V_2$.

Hence, the inner heating element 101 and the further inner heating element 103 are arranged above each other along a vertical direction, such that a vertical temperature gradient is adjustable.

Specifically, the growth surface of the crystals 111, 121 change its vertical position within the crucible 110, 120 due to the growing of the crystal 111, 121. Hence, the temperature at the respective growth surface can be exactly adjusted considering the vertical location of the growth surface. For example, at the region of the growth surface, different temperature may be adjusted with respect to an upper or lower location with respect to the growth surface. However, it is also possible to provide different vertical heating zones within the crucible 120, 130.

According to further exemplary embodiment, the further heating element is an outer heating element 102, wherein the heating system comprises a further outer heating element 104 extending along the first crucible 110 and the second crucible 120 and wherein the outer heating element 102 and the further outer heating element 104 are arranged above each other and spaced apart from each other, such that the lower volume $V_1$ of the heating chamber 140 is heatable by the outer heating element 102 and the upper volume $V_2$ of the heating chamber 140 is heatable by the further outer heating element 104.

Hence, the outer heating element 102 and the further outer heating element 104 are arranged above each other along a vertical direction, such that a vertical temperature gradient is adjustable. Between the lower heating elements 101, 102 and the upper heating elements 103, 104, a plurality of further intermediate heating elements may be arranged in order to provide different temperature sections along the vertical direction.

The heating elements 101, 102, 103, 104 may be, in particular vertically, movably arranged within the heating chamber 140. Hence, the temperature gradient may be adjusted very precisely. For example, the heating elements 101, 102, 103, 104 can be adjusted along the horizontal direction, such that the (horizontal) distance of the heating elements 101, 102, 103, 104 to the respective crucible 110, 120 is adjustable. Additionally or alternatively, the heating elements 101, 102, 103, 104 are adjustable along a vertical direction, such that the heating elements 101, 102, 103, 104 is arrangeable between for example a top 112, 122 and the bottom of the crucible 110, 120 and the plurality of crucibles 130, respectively.

Specifically, the inner heating element 101 and the outer heating element 102 are arranged at the bottom sections of the crucibles 110, 120, wherein above the respective inner and outer heating elements 101, 102 respective further inner and outer heating elements 103, 104 are arranged which are adjustable along a vertical direction with respect to the inner and outer heating elements 101, 102 below. Additionally, also the heating elements 101, 102 arranged at the bottom sections of the crucible 110, 120 may be movable along the vertical direction.

Furthermore, a thermal resistance isolation 105, 106 can be arranged in the heating chamber 140, such that the thermal resistance isolation 105, 106 separates the heating chamber 140 in a first heating volume and a second heating volume.

The thermal resistance isolation comprises a vertical thermal resistance sheet 106 being arranged between the first crucible 110 and the second crucible 120 and extending along a vertical direction for separating the heating chamber in a first heating volume and a second heating volume, wherein the first crucible 110 is arranged in the first heating volume and the second crucible 120 is arranged in the second heating volume. Hence, by the vertical thermal resistance sheet 106, temperature gradients between for example two adjacent crucibles 110, 120 can be adjusted more precisely.

Furthermore, the thermal resistance isolation comprises a horizontal thermal resistance sheet 105 extending in a horizontal direction for separating the heating chamber 140 in an upper volume $V_2$ and a lower volume $V_1$, wherein at least a first upper section of the first crucible 110 is arranged in the first upper volume $V_2$ and at least a first lower section of the first crucible 110 is arranged in the lower volume $V_1$. Hence, the temperature of the crucible 110, 120 in the upper volume $V_2$ and the temperature of the crucible 110, 120 in the lower volume $V_1$ can be adjusted more precisely since both volumes $V_1$, $V_2$ are thermally isolated by the horizontal thermal resistance sheet 105.

The horizontal thermal resistance sheet 105 comprises through holes 107 through which the first crucible 110 and the second crucible 120 are insertable. Hence, the horizontal thermal resistance sheet 105 provides only small gaps to the crucibles 110, 120, 130 and for example to the wall of the heating chamber 140, such that a proper thermal isolation between an upper volume $V_2$ and a lower volume $V_1$ separated by the horizontal thermal resistance sheet 105 is provided.

Specifically, the vertical and/or specifically the horizontal thermal resistance sheet 105, 106 are movable. In particular, the horizontal thermal resistance sheet 105 is mevably movable, in particular along a vertical direction, arranged within the heating chamber 140, such that the height of the first upper volume $V_2$ and the second lower volume $V_1$ is adjustable. The horizontal thermal resistance sheet 105 may be coupled to a vertical guiding rail which is arranged for example at a side wall of the heating chamber 140, such that the horizontal thermal resistance sheet 105 is movable along the vertical guiding rail.

Furthermore, the first crucible 110 and the second crucible 120 are movably arranged within the heating chamber 140. For example, the crucibles 110, 120 may be arranged onto lifting pistons so that the crucibles 110, 120 and are lifted along the vertical direction in order to be moved in a desired temperature zone within the heating chamber 140.

Furthermore, the heating chamber comprises 140 comprises a plurality of viewports 108 through which respective sensors, in particular temperature sensors, are protruding within the heating chamber 140.

Furthermore, the crucibles 110, 120 are coupled to tube lines 109 which are guided through the heating chamber 140 for supplying source material 117 within the crucibles 110, 120 and/or for draining off source material 117 out of the crucibles 110, 120. For example, a plurality of respective tubes lines 109 may be coupled to the respective crucible 110, 120.

In the specific embodiment shown in FIG. 1, the respective tubes lines 109 are coupled to a respective bottom of the crucibles 110, 120. The crucibles 110, 120 comprise in particular a seed fixing section for fixing a seed crystal at the top section 112, 122.

Figure 2:
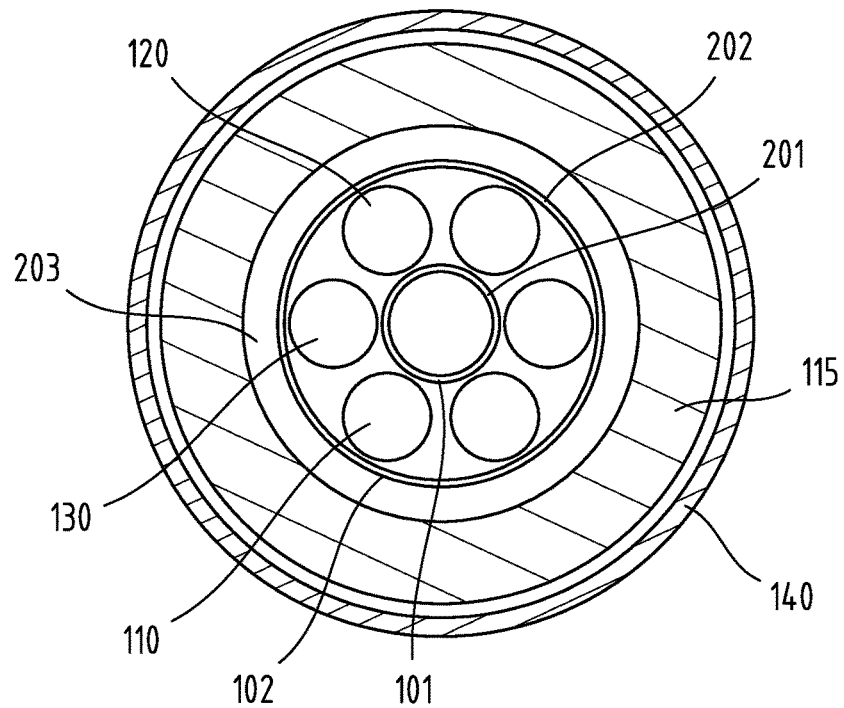
FIG. 2 shows a top view of a crucible device according to an exemplary embodiment of the present invention.

FIG. 2 shows a top view of a crucible device 100 according to an exemplary embodiment of the present invention. A plurality of crucibles 110, 120, 130 are arranged circumferentially around the center of the heating chamber 140.

An inner heating element 101, 103 is formed as an inner heating ring 201. The inner heating ring 201 is arranged between the crucibles 110, 120, 130. The inner heating ring 201 is surrounded by the respective crucibles 110, 120, 130. Hence, the inner region surrounded by the plurality of crucibles 110, 120, 130 can be adjusted with respect to an outer region surrounding the crucibles 110, 120, 130.

Furthermore, a further heating element 102, 104 can be formed as an outer heating ring 202. The crucibles 110, 120, 130 are arranged between the inner heating ring 201 and the outer heating ring 202. The inner sides of the crucibles 110, 120, 130 are directed to the inner heating ring 201 and the outer side of the crucibles 110, 120, 130 are directed to the outer heating ring 202.

The inner heating ring 201 and the outer heating ring 202 are for example resistive heating elements or heating ring tubes which are flushed by heating medium.

For example, a plurality of inner and/or outer heating rings 201, 202 may be arranged above each other. The plurality of heating rings 201, 202 are movable with respect to each other along the vertical direction. Furthermore, the inner or outer heating rings 201, 202 may adjust their diameters in order to adjust the distance between the crucibles 110, 120, 130.

Figure 3:
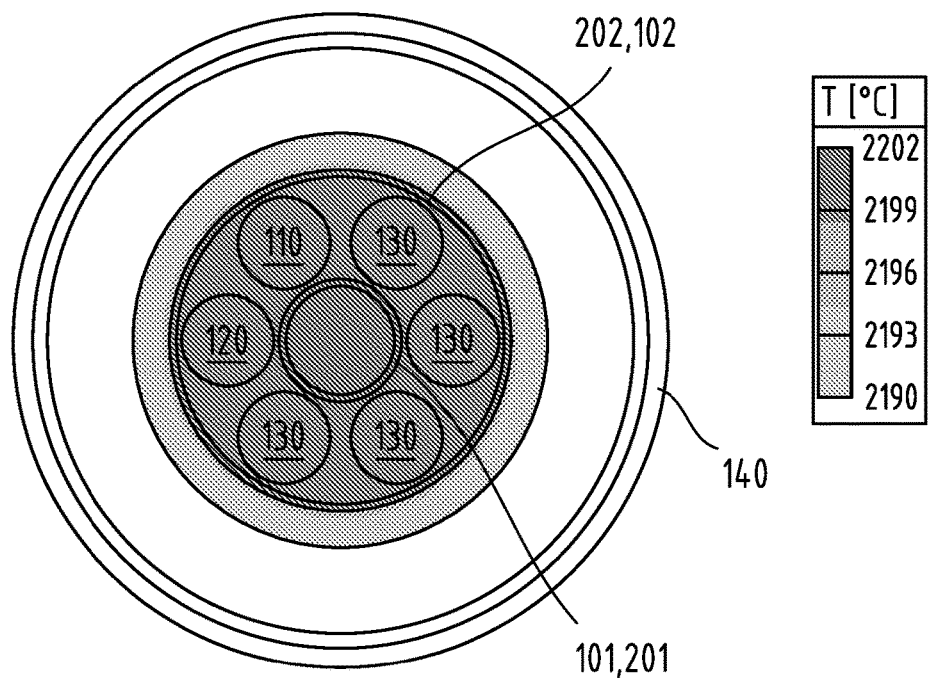
FIG. 3 shows thermal diagram of the crucible device according to FIG. 2.

FIG. 3 shows a thermal diagram of the crucible device according to FIG. 2. the The inner heating ring 201 and the outer heating ring 202 are adjusted in such a manner, that in the region between the inner ring 201 and the outer ring 202 an almost constant temperature is provided, such that all crucibles 110, 120, 130 may have a similar temperature. Specifically, a uniform temperature profile along the horizontal direction can be adjusted.

Figure 4:
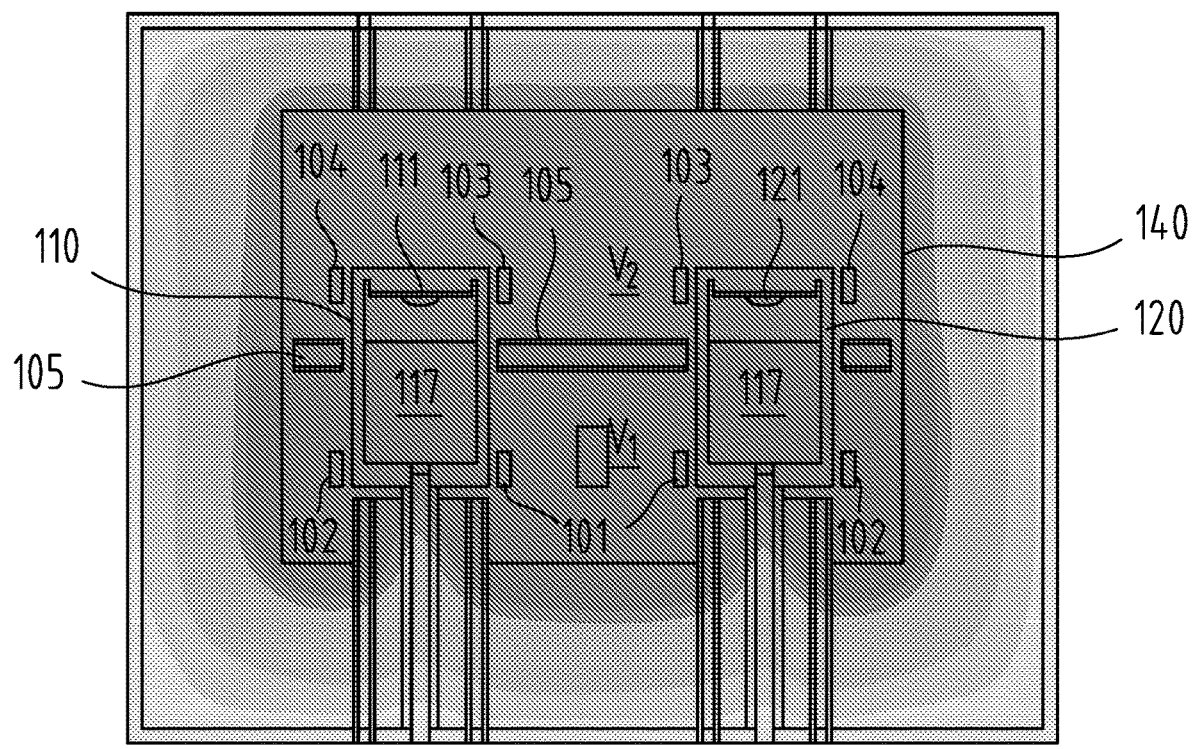
FIG. 4 shows thermal diagram of the crucible device according to FIG. 1.

FIG. 4 shows a thermal diagram of the crucible device 100 according to FIG. 1. The heating elements 101, 102, 103, 104 may be adjusted individually, such that each temperature element 101, 102, 103, 104 radiates a predefined thermal energy into the inner volume of the heating chamber 140. Specifically, in the exemplary embodiment, the lower volume $V_1$ is adjusted with a higher temperature by the heating elements 101, 102 with respect to the upper volume $V_2$ which is adjusted by the further heating elements 103, 104. The temperatures of both volumes $V_1$, $V_2$ can be separated furthermore by the horizontal thermal resistance sheet 105.

Figure 5:
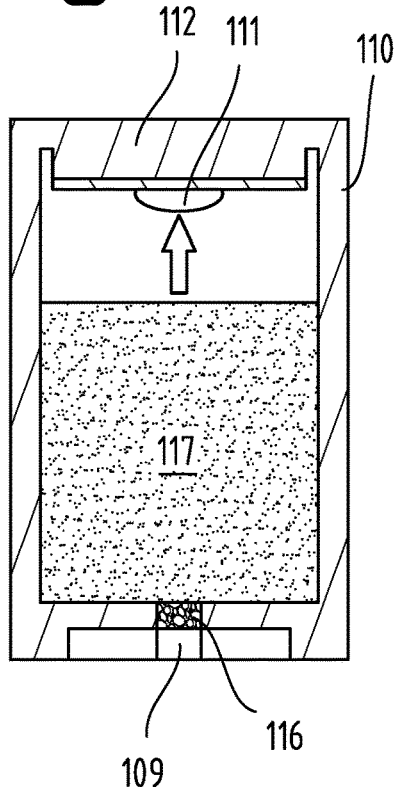
FIG. 5 shows a crucible comprising a porous element in a tube line according to an exemplary embodiment of the present invention.

FIG. 5 shows a crucible 110 comprising a porous element 116 in a tube line 109 according to an exemplary embodiment of the present invention. In a crucible 110, a crystal growth 111 takes place at the top section 112. The source material 117 is filled within the crucible 110. Specifically, the source material 117 is vaporized and the particles of the source material growth on surfaces of the first crystal 111 and the seed crystal, respectively. Specifically, at the end of the tube line 109, a porous element 116 can be installed. Hence, the vaporization of the source material 117 may be improved by pressing the source material 117 through the porous element 116.

Figure 6:
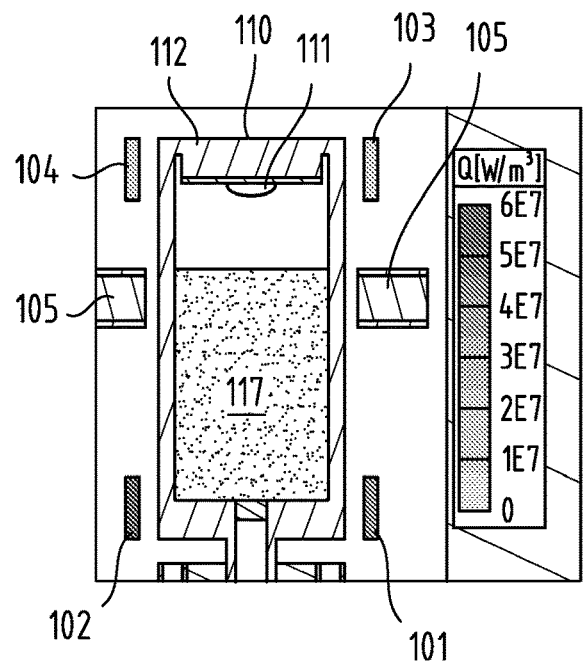
FIG. 6 shows a schematic view of a crucible device comprising four heating elements having different power density according to an exemplary embodiment of the present invention.

FIG. 6 shows a schematic view of a crucible device 100 comprising four heating elements 101, 102, 103, 104 having different power densities. For example, an inner heating element 101 (such as an inner heating ring 201) passes the crucible 110 on the bottom section on the right side. At an opposing left side, an outer heating element 102 (such as an outer heating ring 202) passes the crucible 110. Accordingly, at the top section 112 of the crucible 110, respective inner and outer heating elements 103, 104 (which may also be ring shaped) are arranged at respective inner and outer side of the crucible 110.

Hence, on four sections (the upper section and lower section at the first side and the upper and lower section of an opposing second side) of the crucible 110 specific temperatures may be adjusted, such that a very specific and detailed temperature profile within the crucible volume is adjustable. In order to provide for example an almost uniform temperature profile within the crucible 110, the bottom heating elements 101, 102 may be adjusted with more heating power with respect to the heating elements 103, 104 at the top section 112 of the crucible 110.

Figure 7:
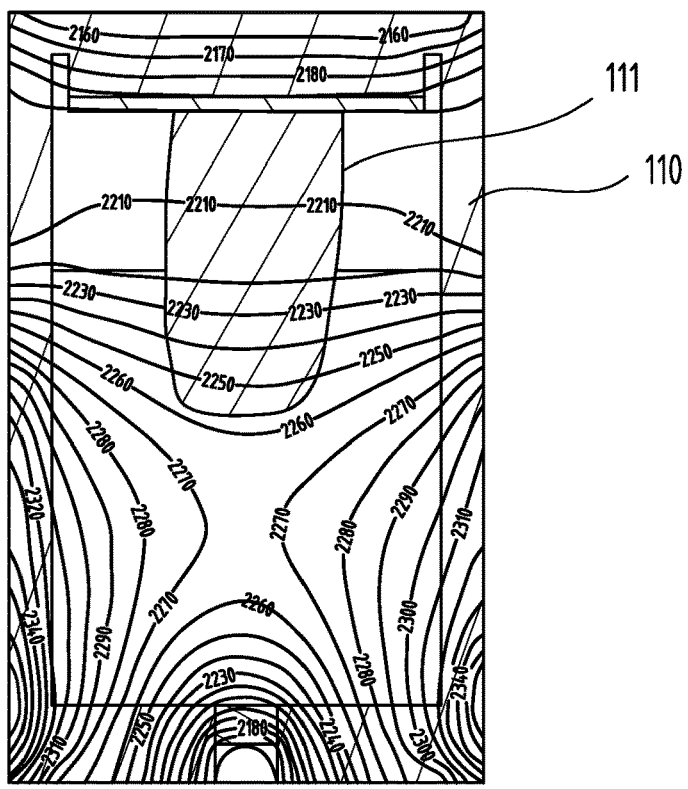
FIG. 7 shows a thermal diagram of a crucible device shown in FIG. 6 according to an exemplary embodiment of the present invention.

FIG. 7 shows a thermal diagram of a crucible device shown in FIG. 6. as can be seen from the isothermal lines running through the crucible 110, the temperature in a center section of the crucible 110, in which the crystal growth takes place, varies between 2200° C. and 2280° C.

This small temperature difference in the growth direction and uniform temperature profile along the crystal surface in such high temperature regions supports a homogeneous and hence a proper crystal growth of a respective crystal 111 within the inner volume of the crucible 110.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

LIST OF REFERENCE SIGNS 100 crucible device
101 inner heating element
102 outer heating element
103 further inner heating element
104 further outer heating element
105 horizontal thermal resistance sheet
106 vertical thermal resistance sheet
107 through hole
108 viewport
109 tube line
110 first crucible
111 first crystal
112 top section
115 isolation
116 porous element
117 source material
120 second crucible
121 second crystal
122 top section
140 heating chamber
201 inner heating ring
202 outer heating ring

The invention claimed is:

1. A crucible device for growing crystals, the crucible device comprising
a heating chamber,
at least a first crucible in which a first crystal is growable,
at least a second crucible in which a second crystal is growable, wherein the first crucible and the second crucible are arranged within the heating chamber spaced apart from each other along a horizontal direction,
a heating system arranged within the heating chamber, the heating system is being configured for adjusting a temperature,
wherein the heating system comprises a thermal resistance isolation arranged in the heating chamber, such that the thermal resistance isolation separates the heating chamber in an upper heating volume and a lower heating volume, the thermal resistance isolation comprising a horizontal thermal resistance sheet extending in a horizontal direction for separating the heating chamber in the upper heating volume and the lower heating volume,
wherein at least a first upper section of the first crucible is arranged in the first upper volume and at least a first lower section of the first crucible is arranged in the lower volume,
wherein the thermal resistance isolation comprises a vertical thermal resistance sheet being arranged between the first crucible and the second crucible and extending along a vertical direction for separating the heating chamber in a first heating volume and a second heating volume, and
wherein the first crucible is arranged in the first heating volume and the second crucible is arranged in the second heating volume,
wherein the heating system comprises an inner heating element and a further inner heating element extending along the first crucible and the second crucible, wherein the inner heating element and the further inner heating element are arranged above each other and spaced apart from each other, such that a lower volume of the heating chamber is heatable by the inner heating element and an upper volume of the heating chamber is heatable by the further inner heating element,
wherein the heating system comprises an outer heating element and a further outer heating element, the outer heating element and the further outer heating element extending along the first crucible and the second crucible,
wherein the outer heating element and the further outer heating element are arranged above each other and spaced apart from each other, such that the lower volume of the heating chamber is heatable by the outer heating element and the upper volume of the heating chamber is heatable by the further outer heating element,
wherein the inner heating element and the outer heating element are arranged below the horizontal thermal resistance sheet and the further inner heating element and the further outer heating element are arranged above the horizontal thermal resistance sheet, and
wherein the horizontal thermal resistance sheet is movably arranged within the heating chamber along a vertical direction, such that the height of the first upper volume and the second lower volume is adjustable.

2. The crucible device according to claim 1,
wherein the further outer heating element is an outer heating ring, and
wherein the first crucible and the second crucible are arranged inside the outer heating ring.

3. The crucible device according to claim 1,
wherein at least the further outer heating element is, vertically movably arranged within the heating chamber.

4. The crucible device according to claim 1,
wherein the horizontal thermal resistance sheet comprises at least one through hole through which the first crucible is insertable, and wherein the horizontal thermal resistance sheet comprises a second through hole through which the second crucible is insertable.

5. The crucible device according to claim 1,
wherein at least the first crucible vertically movably arranged within the heating chamber.

6. The crucible device according to claim 1,
wherein at least the first crucible is rotatably arranged within the heating chamber.

7. The crucible device according to claim 1, further comprising
a rotary table on which the first crucible and the second crucible are arranged,
wherein the rotary table is rotatable with respect to the heating system.

8. The crucible device according to claim 1,
wherein the heating chamber comprises a plurality of viewports through which respective sensors are protruding within the heating chamber.

9. The crucible device according to claim 1,
wherein at least the first crucible comprises a tube line which is guided through the heating chamber for supplying source material within the first crucible and/or for draining off source material out of the first crucible.

10. The crucible device according to claim 9,
wherein the tube line is coupled to a bottom of the first crucible, wherein the first crucible comprises a seed fixing section for fixing a seed crystal, and
wherein the seed fixing section is located at a top section of the crucible.

11. A method for growing crystals, the method comprising adjusting a temperature within a heating chamber along a horizontal and vertical and/or any orientational direction by a heating system arranged within the heating chamber,
wherein at least a first crucible in which a first crystal is growable and a second crucible in which a second crystal is growable are arranged within the heating chamber spaced apart from each other along a horizontal direction, wherein the first crystal and the second crystal are fixed at top sections of the respective first and second crucibles, wherein the heating system comprises a thermal resistance isolation arranged in the heating chamber, such that the thermal resistance isolation separates the heating chamber in an upper heating volume and a lower heating volume, the thermal resistance isolation comprises comprising a horizontal thermal resistance sheet extending in a horizontal direction for separating the heating chamber in the upper heating volume and the lower heating volume,
wherein at least a first upper section of the first crucible is arranged in the first upper volume and at least a first lower section of the first crucible is arranged in the lower volume,
wherein the thermal resistance isolation comprises a vertical thermal resistance sheet being arranged between the first crucible and the second crucible and extending along a vertical direction for separating the heating chamber in a first heating volume and a second heating volume,
wherein the first crucible is arranged in the first heating volume and the second crucible is arranged in the second heating volume,
wherein the heating system comprises an inner heating element and a further inner heating element extending along the first crucible and the second crucible,
wherein the inner heating element and the further inner heating element are arranged above each other and spaced apart from each other, such that a lower volume of the heating chamber is heatable by the inner heating element and an upper volume of the heating chamber is heatable by the further inner heating element,
wherein the heating system comprises an outer heating element and a further outer heating element, the outer heating element and the further outer heating element extending along the first crucible and the second crucible,
wherein the outer heating element and the further outer heating element are arranged above each other and spaced apart from each other, such that the lower volume of the heating chamber is heatable by the outer heating element and the upper volume of the heating chamber is heatable by the further outer heating element,
wherein the inner heating element and the outer heating element are arranged below the horizontal thermal resistance sheet and the further inner heating element and the further outer heating element are arranged above the horizontal thermal resistance sheet, and
wherein the horizontal thermal resistance sheet is movably arranged within the heating chamber along a vertical direction, such that the height of the first upper volume and the second lower volume is adjustable.

* * * * *

UNITED STATES PATENT AND TRADEMARK OFFICE
CERTIFICATE OF CORRECTION

PATENT NO. : 12,281,412 B2
APPLICATION NO. : 17/927810
DATED : April 22, 2025
INVENTOR(S) : Robert Ebner et al.

Page 1 of 1

It is certified that error appears in the above-identified patent and that said Letters Patent is hereby corrected as shown below:

In the Claims

In Column 13, Line 64 (Line 11 of Claim 1), after "system", delete "is"

In Column 14, Line 19 (Line 31 of Claim 1), after "volume,", delete "and"

In Column 14, Line 59 (Line 2 of Claim 3), after "is", delete ","

In Column 15, Line 5 (Line 2 of Claim 5), after "crucible", insert --is--

In Column 15, Line 46 (Line 16 of Claim 11), after "isolation", delete "comprises"

Signed and Sealed this
Twentieth Day of May, 2025

Coke Morgan Stewart
*Acting Director of the United States Patent and Trademark Office*